United States Patent
Fuller et al.

(10) Patent No.: US 7,253,116 B2
(45) Date of Patent: Aug. 7, 2007

(54) HIGH ION ENERGY AND REATIVE SPECIES PARTIAL PRESSURE PLASMA ASH PROCESS

(75) Inventors: Nicholas C. M. Fuller, Elmsford, NY (US); Timothy J. Dalton, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 10/904,608

(22) Filed: Nov. 18, 2004

(65) Prior Publication Data

US 2006/0105576 A1    May 18, 2006

(51) Int. Cl.
*H01L 21/302* (2006.01)
*H01L 21/461* (2006.01)

(52) U.S. Cl. ............... 438/710; 438/700; 257/E21.252

(58) Field of Classification Search ............... 438/710, 438/597, 694, 706; 257/E21.252
See application file for complete search history.

(56) References Cited

U.S. PATENT DOCUMENTS

| | | | |
|---|---|---|---|
| 6,077,769 A | 6/2000 | Huang et al. | |
| 6,218,084 B1 * | 4/2001 | Yang et al. | 430/329 |
| 6,221,772 B1 | 4/2001 | Yang et al. | |
| 6,340,435 B1 | 1/2002 | Bjorkman et al. | |
| 6,352,938 B2 * | 3/2002 | Chen et al. | 438/725 |
| 6,424,044 B1 | 7/2002 | Han et al. | |
| 6,534,397 B1 * | 3/2003 | Okada et al. | 438/633 |
| 6,534,415 B2 | 3/2003 | Wang et al. | |
| 6,583,046 B1 * | 6/2003 | Okada et al. | 438/622 |
| 6,649,531 B2 | 11/2003 | Cote et al. | |
| 6,680,164 B2 * | 1/2004 | Nguyen et al. | 430/329 |
| 6,693,043 B1 * | 2/2004 | Li et al. | 438/725 |
| 6,720,132 B2 | 4/2004 | Tsai et al. | |
| 6,777,344 B2 * | 8/2004 | Annapragada et al. | 438/725 |
| 2001/0005638 A1 * | 6/2001 | Yang et al. | 438/710 |
| 2003/0100190 A1 | 5/2003 | Cote et al. | |
| 2003/0119330 A1 | 6/2003 | Tsai et al. | |
| 2004/0018715 A1 | 1/2004 | Sun et al. | |
| 2005/0009356 A1 * | 1/2005 | Kojima et al. | 438/700 |
| 2005/0158667 A1 * | 7/2005 | Nguyen et al. | 430/322 |

* cited by examiner

*Primary Examiner*—B. William Baumeister
*Assistant Examiner*—Igwe U. Anya
(74) *Attorney, Agent, or Firm*—James J. Cioffi; Joseph Petrokaitis

(57) ABSTRACT

A high ion energy and high pressure $O_2/CO$-based plasma for ashing field photoresist material subsequent to via-level damascene processing. The optimized plasma ashing process is performed at greater than approximately 300 mT pressure and ion energy greater than approximately 500 W conditions with an oxygen partial pressure of greater than approximately 85%. The rapid ash rate of the high pressure/high ion energy process and minimal dissociation conditions (no "source" power is applied) allow minimal interaction between the interlevel dielectric and ash chemistry to achieve minimal overall sidewall modification of less than approximately 5 nm.

20 Claims, 1 Drawing Sheet

HIGH ION ENERGY AND REATIVE SPECIES PARTIAL PRESSURE PLASMA ASH PROCESS

TECHNICAL FIELD

The present invention relates generally to the manufacture of semiconductor devices, and more particularly to interconnect structures, including multilevel interconnect structures, in which a high ion energy/reactive species partial pressure plasma ash process is used during trench or via level processing of organosilicate glass (OSG) based materials to provide minimal inter level dielectric (ILD) modification, thereby improving interconnect/device performance, reliability, and functionality.

DESCRIPTION OF RELATED ART

Semiconductor devices typically include a plurality of circuits which form an integrated circuit including chips (e.g., chip back end of line, or "BEOL"), thin film packages and printed circuit boards. Integrated circuits can be useful for computers and electronic equipment and can contain millions of transistors and other circuit elements that are fabricated on a single silicon crystal substrate. For the device to be functional, a complex network of signal paths will normally be routed to connect the circuit elements distributed on the surface of the device. Efficient routing of these signals across the device can become more difficult as the complexity and number of integrated circuits increase.

Therefore the formation of multi-level or multi-layered interconnection structures have become more desirable due to their efficacy in providing high speed signal routing patterns between large numbers of transistors on a complex semiconductor chip. In the manufacture of such interconnect structures it is usually necessary to construct openings of different depths into a dielectric layer. Vertical openings, such as vias, extend downward vertically through the dielectric layer and horizontal openings, such as a trench or trough, extend partially into a dielectric layer along an essentially horizontal pathway. These vias and trenches will be filled with a conductive metal to form interconnect structures.

A typical interconnect process in which insulators are formed between metal lines is the damascene process. This is a well known metallization process where interconnect vias and trenches are recessed in an insulator by photoresist patterning the features in the planar dielectric and filling the features with metal using conventional methods such as chemical vapor deposition (CVD) or collimated sputtering.

The damascene process eliminates the need for etching to define the metal pattern and thereby increases the choice in the metal composition, such as copper. As semiconductor devices continue to shrink in size a corresponding requirement is high resolution features and critical dimension control. Acceptable photoresist imaging has made wet processing techniques increasingly inadequate. Dry etch photoresist development processes involving plasma etching have been adopted providing improved etching profiles. However, plasma etching has demonstrated problems of its own.

The current interlevel dielectric (ILD) materials are low dielectric constant insulators which are needed to reduce interconnect capacitances as features shrink. These dielectric materials are organosilicate glass (OSG). These are silicon-oxide based materials having compositions denoted as Si:O:C:H. An example is SiCOH which is a hybrid composition of diamondlike carbon (DLC) and $SiO_2$ deposited by plasma enhanced chemical vapor deposition (PECVD) and comprises Si, C, O and H.

A plasma ash, an isotropic etch of organic photoresist in a glow discharge containing oxygen, nitrogen, hydrogen containing gases or combinations thereof, is typically used to remove the patterned photoresist prior to metal deposition in the vias or trenches. A problem with the current plasma ash process is ash induced modification of the OSG ILD material. This "modification" problem results from the plasma ash chemically and physically interacting with any exposed OSG ILD material, i.e., ILD material not covered by photoresist after photoresist patterning, for example, the bottom or base of the trench and via or via sidewalls. This is illustrated in FIG. 1 which shows the remaining post patterned resist 10 overlaying the OSG ILD 20 and the exposed OSG ILD features 30.

As a result of this interaction the Si—C and Si—CH bonds are readily broken which leads to subsequent carbon removal or replacement. This is undesirable because the subsequent removal of carbon raises the dielectric constant of the OSG ILD which in turn raises the line to line capacitance of the interconnect structure. Carbon removal is also associated with problems of current leakage and decreased device reliability.

Since modification of the OSG ILD also occurs during line-level damascene process, for dual damascene structures, the thickness of this modified layer is dependent on both via and line-level ashing processes. Further, since the thickness of this modified layer (if retained or removed) influences line-to-line leakage and capacitance and hence overall interconnect performance, functionality and reliability, it is very desirable to minimize the thickness of this modified layer formed during the via-level ashing process.

Thus there is a need for an improved plasma ash process that will decrease the modification of the exposed OSG ILD during photoresist removal.

It is therefore an object of the present invention to provide a BEOL interconnect structure in which there is minimal ILD modification.

It is a further object of the present invention to provide a BEOL interconnect structure of improved performance, reliability, and functionality.

BRIEF SUMMARY OF THE INVENTION

The objectives of the present invention have been achieved by providing a method of forming a semiconductor interconnect structure having a modified layer of minimal thickness comprising the steps of providing a OSG structure having conductive features; providing a photoresist covering at least a portion of the OSG structure and where at least a portion of the OSG structure is not covered by the photoresist; removing the photoresist with a high energy reactive species partial pressure plasma ash process, and thereby providing the OSG structure not covered by the photoresist with a minimal modified thickness.

The high energy reactive species partial pressure plasma ash process comprises $O_2$, CO or $CO_2$ or combinations thereof. The plasma ash process has an input bias power/oxygen partial pressure ratio less than approximately 2.0 W/mT. The input bias has a power of approximately 200 W to approximately 600 W. The input bias has a frequency less than or equal to 13.56 MHz. The plasma ash process has a source power of less than approximately 50 W and a source frequency of greater than or equal to 27 MHz. The plasma ash process has an oxygen partial pressure of greater than approximately 300 mT and the percentage of dissociation of the plasma ash is less than approximately 10%. The plasma density of the plasma ash process is less than approximately $10^{11}$ cm$^{-3}$.

In another embodiment of the present invention there is provided a high energy reactive species partial pressure plasma ash process comprises $N_2$ and $H_2$ or $NH_3$. The plasma ash process has an input bias power/reactive species partial pressure ratio of less than approximately 0.75 W/mT. The $N_2$ partial pressure is greater than approximately 400 mT, the $H_2$ partial pressure is greater than approximately 80 mT, and the $NH_3$ partial pressure is greater than approximately 300 mT. The plasma ash process has an input bias power less than approximately 300 W and an input bias frequency less than or equal to 13.56 MHz. The plasma ash process has a source power less than approximately 50 W and a source frequency of greater than or equal to 27 MHz. The percentage of dissociation of the plasma ash is less than approximately 10% and the plasma density is less than approximately $10^{11}$ cm$^{-3}$.

In another embodiment of the present invention there is provided a plasma ash composition consisting essentially of a $O_2$, CO or $CO_2$, or combination thereof, based plasma with a pressure greater than approximately 300 mT; a high ion energy between approximately 200 W to approximately 600 W and approximately 2 MHz frequency; a small input bias power to oxygen partial pressure ratio of less than approximately 2.0 W/mT and an oxygen partial pressure greater than approximately 85%. In a preferred embodiment no source power is applied.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The objectives of the present invention have been achieved by providing an interconnect structure built in a dense OSG low-κ dielectric film in which a "high" ion energy of approximately 200 W to 600 W at approximately 2 MHz frequency and a "small" input "bias" power/oxygen partial pressure ratio of less than approximately 2.0 W/mT ash process is used during via or trench level damascene processing thereby improving device/BEOL interconnect performance, reliability and functionality.

Figure 2:
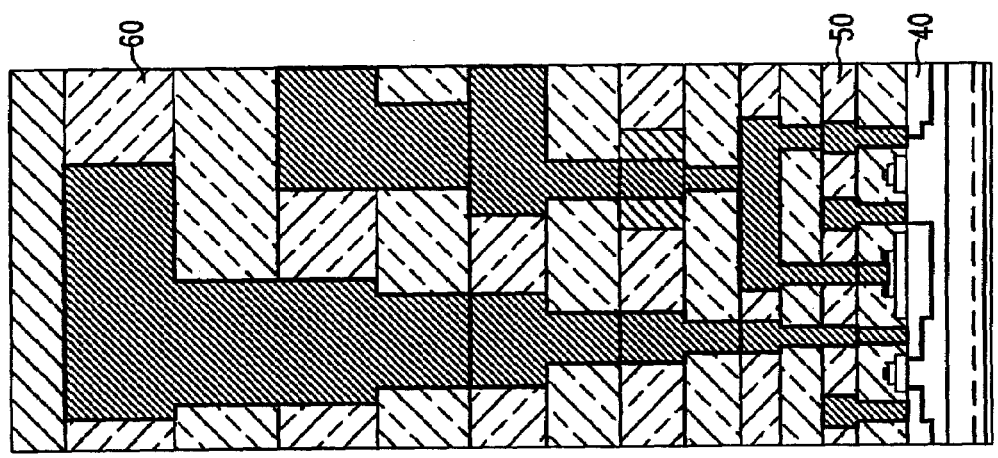
FIG. 2 is a schematic cross section view of a back end of line interconnect structure.
Figure 1:
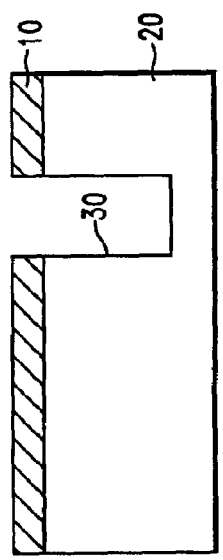
FIG. 1 is a schematic cross section view of a conventional dual-damascene process.

An example of the present invention is described with reference to FIG. 2 which illustrates a BEOL interconnect structure formed on an integrated circuit chip 40 consisting of at least 2 to 8 wiring levels fabricated at a minimum lithographic feature size designated about 1× (referred to as "thinwires") and above these levels are about 2 to 4 wiring levels fabricated at a width equal to about 2× and/or about 4× the minimum width of the thinwires (referred to as "fatwires"). In one class of structures, the thinwires are formed in a low dielectric constant organosilicate (SiCOH) inter-level dielectric (ILD) layer 50, and the fatwires are made in a silicon dioxide ILD 60 having a dielectric constant of about 4.

As described above one of the many challenges associated with the fabrication of the thin and fatwires for 90 nm and beyond CMOS BEOL technologies is the problem of ash induced modification of the OSG ILD material during damascene processing. This ashing step occurs subsequent to via (trench) definition in the prior etching processes. Since the via (trench) structure has already been defined the chemistry employed to remove the photoresist or other organic material that served as the pattern transfer layer is capable of chemically and physically interacting with the exposed ILD material in the via (trench) structure.

Since the Si—C (Si—CH$_x$; x=1 to 3) bond of this dense OSG type materials is readily broken, subsequent carbon removal ("de-methylation") and/or displacement of carbon by oxygen or other species can readily occur under energetically feasible conditions and therefore optimizing the plasma ash process is critical. The present invention optimizes the ash using the available chemistry choices which include oxygen-based or nitrogen/hydrogen-based options.

The inventors have discovered that oxygen based chemistries induce less modification on dense OSG ILD materials than nitrogen and/or hydrogen-based processes under appropriate conditions. This is believed to be due to the following factors. First, the enhanced ashing rate of the former vs. the latter (so the ILD is exposed for a shorter time with the oxygen-based process). Second, the ease of diffusivity of hydrogen into dense OSG type films, and finally, the ready reactivity of oxygen radicals with dangling Si bonds serve to passivate the exposed ILD surface. Even with the employment of an oxygen-based ashing process for via (trench) damascene processing the extent of ILD sidewall (SW) modification can vary from less than 5 nm to approximately 30 nm.

Therefore, although the post lithography critical dimension (CD) and post etch aqueous process (typically employed to remove the modified layer) can be tailored so as to accommodate varying degrees of sidewall modification and achieve target integrated critical dimensions, minimization of the thickness of this modified layer facilitates a stable integrated interconnect process flow. To this end, we disclose the use of conditions that are seemingly counterintuitive to reduce the degree of ILD modification and achieve the aforementioned objectives.

A preferred embodiment of the present invention employs the use of a high ion energy and high pressure $O_2$/CO-based plasma for ashing field photoresist material subsequent to via-level damascene processing. These optimized conditions result in an overall modified SiCOH sidewall thickness of 5 nm (post line-level processing) which is easily removed with diluted HF such that the BEOL interconnect structure achieves target performance, functionality, and reliability.

This ashing process is performed at greater than approximately 300 mT pressure and ion energy greater than approximately 500 W conditions with an oxygen partial pressure of greater than approximately 85% to achieve minimal overall sidewall modification of less than approximately 5 nm. This is possible due to the rapid ash rate of the high pressure/high ion energy process and minimal dissociation conditions (no "source" power is applied), as such minimal interaction occurs between ILD and ash chemistry. Further, the use of high ion energy facilitates increased directionality of plasma ionic species decreasing the probability of ion impact to the SiCOH ILD sidewall and thus retarding the formation of surface sites that would lead adsorption-induced film modification.

The ash processing conditions employed, (1) a "small" input "bias" power/oxygen partial pressure ratio less than approximately 2.0 W/mT and (2) a relatively "high" ion energy of approximately 200 to 600 W at approximately 2 MHz frequency, ensure that the gas is minimally dissociated so as to reduce the extent of ILD modification, while still providing sufficient radicals coupled with a relatively high ion energy so as to achieve an appreciable ash rate of approximately 1 micron/min.

These conditions are optimized so that the distributed coupled power per unit reactive species is minimized while maintaining high ion energy for ion directionality and an enhanced ashing rate. The former is achieved by operating in high reactive species ($O_2$) partial pressure regimes of greater than approximately 300 mT and utilizing a coupled "bias" at a frequency of approximately 2 MHz and a power of less than approximately 600 W. First, given that the "bias" frequency is low (approximately 2 MHz) the coupling efficiency is reduced ensuring that a minor fraction of the input power is coupled into the plasma for the generation of atomic radicals and ions. This feature, coupled with the "large" oxygen partial pressure/input power ratio, creates plasma conditions that ensure minimal gas dissociation of less than approximately 10% and medium density conditions of less than approximately $10^{11}$ cm$^{-3}$.

Since the reactive oxygen radicals are responsible for modifying the ILD material, these conditions facilitate minimal ILD modification. Since the primary objective of oxygen radicals is to remove the photoresist or organic material, the minimal oxygen radical density could reduce the ash rate and render the process ineffective. However, the plasma ash process also ensures that the power coupled per unit molecule is minimal so that the concentration of reactive species coupled with the relatively high ion energy conditions maintains a sufficient ash rate but induce minimal dense OSG ILD modification. By operating under "high" ion energy conditions, the "bias" frequency serves a two-fold objective, namely creation of the plasma species (radicals and ions) in addition to generating a sufficiently large sheath potential (potential difference between bulk plasma and exposed wafer) to attract positive ions to the wafer (and field photoresist/organic material) surfaces; using a "bias" power in the range of approximately 200 to 600 W facilitates a sufficient ash rate of approximately 1 μgm/min.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a semiconductor interconnect structure having a modified layer of minimal thickness comprising the steps of:
   providing an organosilicate glass structure having conductive features;
   providing a photoresist covering at least a portion of said organosilicate glass structure and where at least a portion of said organosilicate glass structure is not covered by said photoresist;
   removing said photoresist with a high energy reactive species partial pressure plasma ash process, wherein said plasma ash process comprises O2, CO or CO2 or combinations thereof and has an input bias power/oxygen partial pressure ratio less than approximately 2.0 W/mT-1, said input bias has a power of approximately 200 W to approximately 600 W and a frequency less than or equal to 13.56 MHz, and has a source power of less than approximately 50 W and thereby providing said organosilicate glass structure not covered by said photoresist with a minimal modified thickness.

2. The method of claim 1 wherein said plasma ash process has a source frequency of greater than or equal to 27 MHz.

3. The method of claim 1 wherein said plasma ash process has an oxygen partial pressure of greater than approximately 300 mT.

4. The method of claim 1 wherein the plasma density of said plasma ash process is less than approximately 1011 cm−3.

5. The method of claim 1 wherein said semiconductor interconnect structure has at least one via or trench.

6. The method of claim 5 wherein said minimal modified layer is formed at the via or trench level.

7. The method of claim 1 wherein said minimal modified layer is less than 5 nm.

8. The method of claim 1 further comprising the step of removing said minimal modified thickness with diluted HF.

9. A method of forming a semiconductor interconnect structure having a modified layer of minimal thickness comprising the steps of:
   providing an organosilicate glass structure having conductive features;
   providing a photoresist covering at least a portion of said organosilicate glass structure and where at least a portion of said organosilicate glass structure is not covered by said photoresist;
   removing said photoresist with a high energy reactive species partial pressure plasma ash process, wherein said high energy reactive species partial pressure plasma ash process comprises O2, CO or CO2 or combinations thereof and thereby providing said organosilicate glass structure not covered by said photoresist with a minimal modified thickness wherein the percentage of dissociation of said plasma ash is less than approximately 10%.

10. A method of forming a semiconductor interconnect structure having a modified layer of minimal thickness comprising the steps of:
    providing an organosilicate glass structure having conductive features;
    providing a photoresist covering at least a portion of said organosilicate glass structure and where at least a portion of said organosilicate glass structure is not covered by said photoresist;
    removing said photoresist with a high energy reactive species partial pressure plasma ash process, wherein said plasma ash process comprises N2 and H2 or NH3 and has an input bias power less than approximately 300 W and an input bias frequency less than or equal to 13.56 MHz and a source power less than approximately 50 W and thereby providing said organosilicate glass structure not covered by said photoresist with a minimal modified thickness.

11. The method of claim 10 wherein said plasma ash process has an input bias power/reactive species partial pressure ratio of less than approximately 0.75 W/mT−1.

12. The method of claim 11 wherein the N2 partial pressure is greater than approximately 400 mT.

13. The method of claim 11 wherein the H2 partial pressure is greater than approximately 80 mT.

14. The method of claim 11 wherein the NH3 partial pressure is greater than approximately 300 mT.

15. The method of claim 10 wherein said plasma ash process has a source frequency of greater than or equal to 27 MHz.

16. The method of claim 10 wherein the percentage of dissociation of said plasma ash is less than approximately 10%.

17. The method of claim 10 wherein the plasma density of said plasma ash process is less than approximately $10^{11}$ cm$^{-3}$.

18. The method of claim 10 wherein said minimal modified layer is less than 10 nm.

19. A plasma ash composition consisting essentially of:
- a O2, CO or CO2, or combination thereof, based plasma with a pressure greater than approximately 300 mT;
- a high ion energy between approximately 200 W to approximately 600 W and approximately 2 MHz frequency;
- a small input bias power to oxygen partial pressure ratio of less than approximately 2.0 W/mT; and
- an oxygen partial pressure greater than approximately 85%.

20. The plasma ash composition of claim 19 wherein no source power is applied.

* * * * *